(12) United States Patent
Chin et al.

(10) Patent No.: US 10,061,527 B2
(45) Date of Patent: *Aug. 28, 2018

(54) MEMORY SYSTEM AND CONTROLLER

(71) Applicant: Toshiba Memory Corporation, Tokyo (JP)

(72) Inventors: Yoon Tze Chin, Yokohama (JP); Norikazu Yoshida, Kawasaki (JP); Mitsuru Anazawa, Sagamihara (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/714,710

(22) Filed: Sep. 25, 2017

(65) Prior Publication Data

US 2018/0018119 A1     Jan. 18, 2018

Related U.S. Application Data

(63) Continuation of application No. 15/061,216, filed on Mar. 4, 2016, now Pat. No. 9,804,795.

(60) Provisional application No. 62/216,097, filed on Sep. 9, 2015.

(51) Int. Cl.
| | |
|---|---|
| *G11C 5/14* | (2006.01) |
| *G06F 3/06* | (2006.01) |
| *G11C 11/4074* | (2006.01) |
| *G11C 16/30* | (2006.01) |

(52) U.S. Cl.
CPC ......... *G06F 3/0625* (2013.01); *G06F 3/0634* (2013.01); *G06F 3/0679* (2013.01); *G11C 5/14* (2013.01); *G11C 5/143* (2013.01); *G11C 5/147* (2013.01); *G11C 11/4074* (2013.01); *G11C 16/30* (2013.01)

(58) Field of Classification Search
CPC .... G06F 3/0625; G06F 3/0634; G06F 3/0679; G11C 5/14; G11C 5/143; G11C 5/147; G11C 16/30; G11C 11/4074

See application file for complete search history.

(56) References Cited

U.S. PATENT DOCUMENTS

| | | | |
|---|---|---|---|
| 7,688,621 B2 * | 3/2010 | Cho | G11C 7/1078 365/163 |
| 8,284,603 B2 * | 10/2012 | Park | G11C 16/26 365/185.12 |
| 9,170,887 B2 | 10/2015 | Nakamura | |
| 9,324,444 B2 | 4/2016 | Park | |
| (Continued) | | | |

FOREIGN PATENT DOCUMENTS

| | | |
|---|---|---|
| JP | 2010-26950 | 2/2010 |
| JP | 2011-154556 | 8/2011 |

*Primary Examiner* — Pho M Luu (74) *Attorney, Agent, or Firm* — Oblon, McClelland, Maier & Neustadt, L.L.P.

(57) ABSTRACT

A memory system includes non-volatile memory. The memory system includes a controller that controls data transfer between a host and the non-volatile memory, and a power supply unit that supplies a voltage to the controller. Further, the controller includes a power supply control unit that determines the voltage supplied to a module in the controller on the basis of an operation condition determined with the host. The power supply unit adjusts the voltage supplied to the module in accordance with a command from the power supply control unit.

20 Claims, 8 Drawing Sheets

(56) References Cited

U.S. PATENT DOCUMENTS

| | | | |
|---|---|---|---|
| 9,460,815 B2 | 10/2016 | Sivasankaran | |
| 9,502,095 B1 | 11/2016 | Kang | |
| 9,785,383 B2 * | 10/2017 | Amaki | G06F 3/0679 |
| 9,804,795 B2 * | 10/2017 | Chin | G06F 3/0625 |
| 2011/0185145 A1 | 7/2011 | Moro | |
| 2014/0359196 A1 | 12/2014 | Ragland et al. | |
| 2016/0103478 A1 | 4/2016 | Nakanishi | |

* cited by examiner

MEMORY SYSTEM AND CONTROLLER

CROSS-REFERENCE TO RELATED APPLICATIONS

This application is a continuation application of U.S. application Ser. No. 15/061,216 filed Mar. 4, 2016, now U.S. Pat. No. 9,804,795, which is based upon and claims the benefit of priority from U.S. Provisional Application No. 62/216,097, filed on Sep. 9, 2015; the entire contents of each are incorporated herein by reference.

FIELD

The present embodiment generally relates to a memory system and a controller.

BACKGROUND

A storage device using a storage medium such as NAND memory is known. A management method for reducing electric power consumed by a storage device or electric power consumed by an information processing system equipped with a storage device has been suggested.

DETAILED DESCRIPTION

According to the present embodiment, a memory system is provided. The memory system includes non-volatile memory configured to store user data received from a host. The memory system includes a controller configured to control data transfer between the host and the non-volatile memory, and a power supply unit configured to supply a voltage to the controller. Further, the controller includes a power supply control unit configured to determine the voltage supplied to a module in the controller on the basis of an operation condition determined with the host. The power supply unit adjusts the voltage supplied to the module in accordance with a command from the power supply control unit.

Hereinafter, a memory system and a controller according to embodiments will be explained in details with reference to appended drawings. It should be noted that the present invention is not limited by these embodiments.

Embodiments

Figure 1:
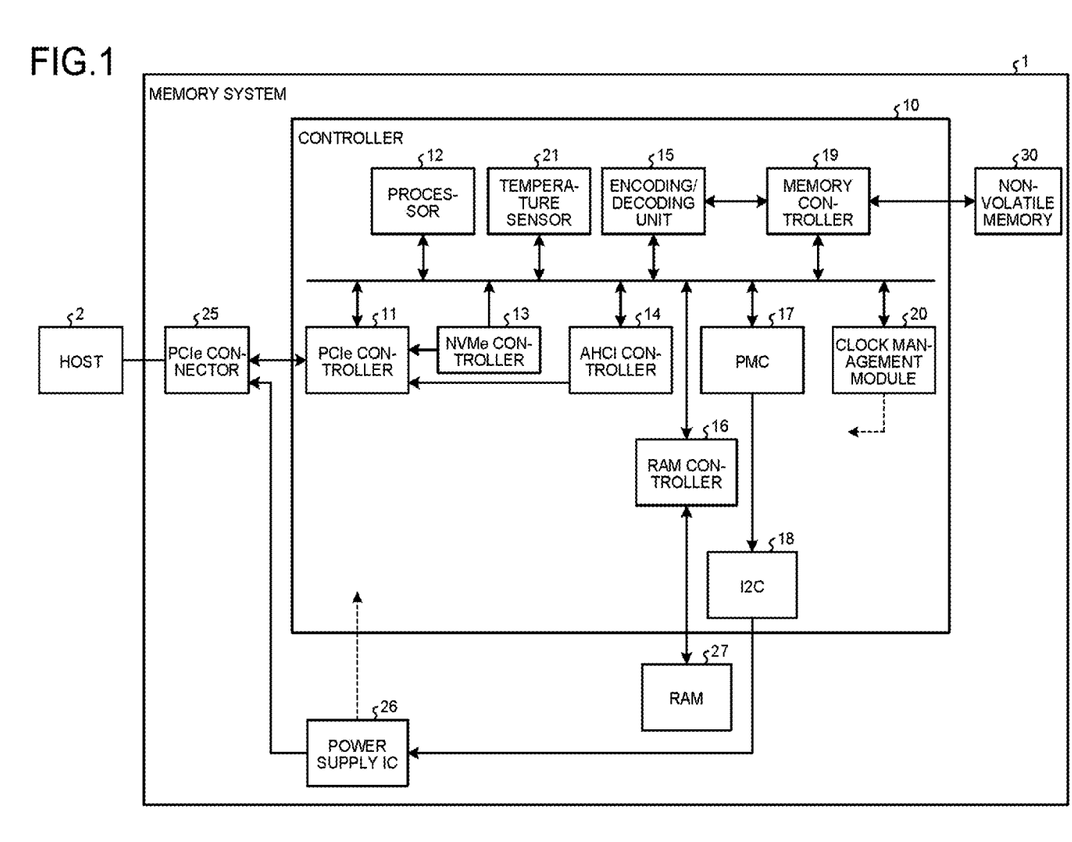
FIG. 1 is a figure illustrating a configuration of an information processing system according to an embodiment.

FIG. 1 is a figure illustrating a configuration of an information processing system according to an embodiment. The information processing system includes a host (external device) 2 and a memory system (memory device) 1 operating as an external storage device for the host 2. The host 2 may be, for example, an information processing device such as a personal computer, a server, and the like or a portable telephone, an image-capturing device, or may be a portable terminal such as a tablet computer, a smartphone, and the like, or may be a game machine, or may be a car-mounted terminal such as a car navigation system.

In the following explanation, a case where the memory system 1 is an SSD (Solid State Drive) will be explained, but the memory system 1 may be, for example, a storage device other than an SSD, such as a hard disk drive (HDD), a hybrid disk drive, an SD card, a USB memory, a magnetic type, and the like. In the information processing system according to the present embodiment, the memory system 1 changes an operation voltage, a clock frequency during operation, and the like, in accordance with the performance (processing ability) of the host 2.

The memory system 1 is an external storage device configured to be able to connect to the host 2. The memory system 1 is connected to the host 2 via a predetermined communication interface. For example, PCIe (Peripheral Component Interconnect Express), SATA (Serial Advanced Technology Attachment), SAS (Serial Attached SCSI), and the like may be employed as the specification (standard) of the communication interface. In the following explanation, a case where the memory system 1 communicates with the host 2 via PCIe will be explained.

The memory system 1 includes a controller 10, non-volatile memory 30, a PCIe connector 25, a power supply IC 26, and RAM (Random Access Memory) 27. Further, the non-volatile memory 30 and the controller 10 are connected via a bus. It should be noted that the controller 10 may also be referred to as an SSD controller.

The non-volatile memory 30 is, for example, NAND-type flash memory (hereinafter abbreviated as NAND memory). In this case, an example where NAND memory is used as the non-volatile memory 30 will be explained, but storage means other than NAND memory, such as three-dimensional structure flash memory, ReRAM (Resistance Random Access Memory), FeRAM (Ferroelectric Random Access Memory) may also be used as the non-volatile memory 30. The non-volatile memory 30 stores user data and the like transmitted from the host 2.

The non-volatile memory 30 includes one or more memory chips having a memory cell array. The memory cell array includes multiple memory cells arranged in a matrix form. The memory cell array has multiple blocks, which are units of erasing of data. Each block is constituted by multiple physical sectors.

Figure 2:
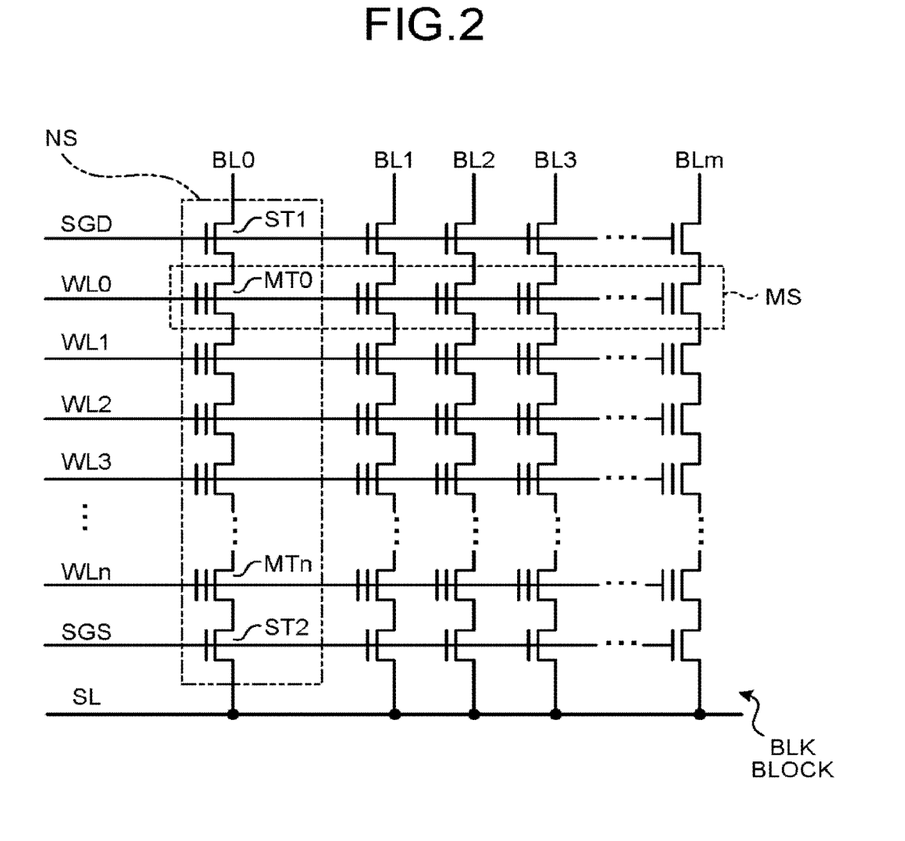
FIG. 2 is a figure illustrating an example of a configuration of a block of a memory cell array.

FIG. 2 is a figure illustrating an example of a configuration of a block of a memory cell array. FIG. 2 illustrates one of multiple blocks constituting a memory cell array. The other blocks of the memory cell array also have the same configuration as FIG. 2. As illustrated FIG. 2, a block BLK of the memory cell array has (m+1) (m is an integer equal to or more than zero) NAND strings NS. Each NAND string NS includes (n+1) (n is an integer equal to or more than zero) memory cell transistors MT0 to MTn connected in series win which adjacent memory cell transistors MT share a diffusion region (a source region or a drain region) and selection transistors ST1, ST2 arranged at both ends of the column of the (n+1) memory cell transistors MT0 to MTn.

The control gate electrodes of the memory cell transistors MT0 to MTn constituting the NAND string NS are respectively connected to the word lines WL0 to WLn, and the memory cell transistors MTi (i=0 to n) in the NAND strings NS are commonly connected by the same word line WLi (i=0 to n). More specifically, the control gate electrodes of the memory cell transistors MTi in the same row in the block BLK are connected to the same word line WLi.

Each of the memory cell transistors MT0 to MTn is constituted by a field effect transistor having a stacked gate structure formed on a semiconductor substrate. In this case, the stacked gate structure includes a charge storage layer (floating gate electrode) with a gate insulating film interposed therebetween on the semiconductor substrate and a control gate electrode formed this charge storage layer with the inter-gate insulating film interposed therebetween. In the memory cell transistors MT0 to MTn, the threshold value voltage changes in accordance with the number of electrons accumulated in the floating gate electrode, and can store data in accordance with the difference in the threshold value voltage.

The bit lines BL0 to BLm are connected to the drains of the (m+1) selection transistors ST1 in a single block BLK, and a selection gate line SGD is commonly connected to the gates. The source of the selection transistor ST1 is connected to the drain of the memory cell transistor MT0. Likewise, a source line SL is commonly connected to the sources of the (m+1) selection transistors ST2 in the single block BLK, and a selection gate line SGS is commonly connected to the gates. The drain of the selection transistor ST2 is connected to the source of the memory cell transistor MTn.

Each memory cell is connected to a word line and is also connected to a bit line. Each memory cell can be identified by an address for identifying a word line and an address for identifying a bit line. As described above, data in multiple memory cells (memory cell transistors MT) in the same block BLK are erased at a time. On the other hand, reading and writing of data are performed in units of pages. In a case where each memory cell can store only a binary value, a single page corresponds to a single physical sector MS including multiple memory cells connected to a single word line.

In a case where each memory cell is capable of multi-value storage, and the memory cell is caused to operate in a single level cell (SLC) mode, a single physical sector MS corresponds to a single page. In a case where the memory cell is caused to operate in a multi level cell (MLC) mode, a single physical sector MS corresponds to N pages (N is a natural number equal to or more than two). In a case where N is two, a single physical sector MS corresponds to two pages, and in a case where N is three, a single physical sector MS corresponds to three pages.

During read operation and program operation, a single word line is selected and a single physical sector MS is selected in accordance with a physical address. Switching of pages in the single physical sector MS is performed with a physical address.

The PCIe connector 25 is connected to the host 2 and the controller 10. The power supply IC 26 is connected to the PCIe connector 25 and the controller 10. It should be noted that the power supply IC 26 is connected to each module of the controller 10, but is not illustrated in the drawing. The module may also be referred to as a constituent component. The RAM 27 is connected to the controller 10.

The controller 10 controls the non-volatile memory 30, and also controls data transfer with the host 2. The controller 10 according to the present embodiment adjusts the voltage supplied to each module (IP: Intellectual Property) in the controller 10 in accordance with a PCIe interface speed (hereinafter referred to as Gen information) determined to be used with the host 2.

The controller 10 includes a PCIe controller (which may be also referred to as a PCIe Endpoint) 11 serving as a host I/F (interface), an NVMe controller 13, and an AHCI controller 14. The controller 10 includes a processor 12, an encoding/decoding unit 15, a RAM controller 16, and a memory controller (which may be also referred to as a NAND controller) 19. The RAM controller 16 has a function of a RAM I/F which is a communication interface with the RAM 27. The memory controller 19 has a function of a memory I/F which is a communication interface with the non-volatile memory 30. Further, the controller 10 includes a PMC 17, an I2C 18, a clock management module (which may also be referred to as a clock management unit) 20, and a temperature sensor 21.

The PCIe controller 11, the NVMe controller 13, the AHCI controller 14, the processor 12, the encoding/decoding unit 15, the RAM controller 16, the memory controller 19, the PMC 17, the clock management module 20, and the temperature sensor 21 are connected by a bus in the controller 10. In the controller 10, the PCIe controller 11 and the NVMe controller 13 are connected, the PCIe controller 11 and the AHCI controller 14 are connected. Further, in the controller 10, the I2C 18 is connected to the PMC 17.

The PCIe controller 11 controls data communication with the host 2. The PCIe controller 11 is connected to the PCIe connector 25. The NVMe (Non Volatile Memory Express) controller 13 controls data transfer between the host 2 and the non-volatile memory 30. The NVMe controller 13 receives data from the host 2 via the PCIe controller 11, and transmits the data via the bus to the non-volatile memory 30. The NVMe controller 13 receives data via the bus from the non-volatile memory 30, and transmits the data via the PCIe controller 11 to the host 2.

When the memory system 1 is powered on, the PCIe controller 11 executes a training sequence with the host 2. The PCIe controller 11 sends the PMC 17 the PCIe Gen information and the number of lanes (lanes) used for the communication with the host 2 as an execution result of the training.

The AHCI (Advanced Host Controller Interface) controller 14 controls data communication so that the non-volatile memory 30 is deemed as a storage device connected to the host 2. The AHCI controller 14 receives data via the PCIe controller 11 from the host 2, and transmits the data via the bus to the non-volatile memory 30. The AHCI controller 14 receives the data via the bus from the non-volatile memory 30, and transmits the data via the PCIe controller 11 to the host 2.

The processor 12 is a control unit centrally controlling each constituent element of the controller 10, and is, for example, constituted by a CPU (Central Processing Unit), an MPU (Micro Controller Unit), and the like. In a case where the processor 12 receives a command from the host 2, the processor 12 performs control in accordance with the command. For example, the processor 12 commands the memory controller 19 to write user data and parity to the non-volatile memory 30 in accordance with the command from the host 2. The processor 12 commands the memory controller 19 to read the user data and the parity from the non-volatile memory 30 in accordance with the command from the host 2. Data other than the user data, i.e., data used for control inside of the memory system 1 (management information), may also be transferred to the non-volatile memory 30. In this case, the processor 12 also commands the memory controller 19 to write and read the management data.

The processor 12 determines a storing region (storing position) on the non-volatile memory 30 for the user data stored in the RAM 27. The user data are stored to the RAM 27 via the bus.

The processor 12 determines a memory region of the non-volatile memory 30 to which user data are written for each of the user data. A physical address is allocated to the memory region of the non-volatile memory 30. The processor 12 manages the memory region, in which the data are to be written, by using the physical address. The processor 12 designates the determined memory region (physical address), and commands the memory controller 19 to write the user data to the non-volatile memory 30. A correspondence between a logical address of user data received from the host 2 and a physical address indicating a storing region on the non-volatile memory 30 where the user data are stored is stored in the RAM 27 as an address translation table.

The logical address is the address of the user data managed by the host 2. The address translation table may directly indicate the correspondence of the logical address and the physical address, or may be multi-level tables. The multi-level tables are multiple tables used to once translate a logical address into an intermediate address and then translate the intermediate address into a physical address.

In a case where the processor 12 receives a read request from the host 2, the processor 12 translates the logical address designated by the read request into a physical address by using the address translation table, and commands the memory controller 19 to read from physical address.

The encoding/decoding unit 15 performs encoding of data sent from the host 2 to the non-volatile memory 30 and decoding of data sent from the non-volatile memory 30 to the host 2. More specifically, the encoding/decoding unit 15 generates code words by encoding the data (the user data and the management information) to be stored in the non-volatile memory 30. The method of encoding of the user data and the method of encoding of the management data may be different or may be the same. Any method may be used as the method of the encoding. For example, RS (Reed Solomon) encoding, BCH (Bose Chaudhuri Hocquenghem) encoding, LDPC (Low Density Parity Check) encoding, and the like can be used. IN addition, the encoding/decoding unit 15 carries out decoding processing of code words that are read from the non-volatile memory 30.

The RAM controller 16 is connected via the RAM interface to the RAM 27. The RAM controller 16 performs data communication with the RAM 27. The RAM controller 16 performs processing for writing user data to the RAM 27 on the basis of a command of the processor 12. In addition, the RAM controller 16 performs processing for reading from the RAM 27 on the basis of a command of the processor 12.

The memory controller 19 is connected via the memory interface (which may also be referred to as a NAND interface) to the non-volatile memory 30. The memory controller 19 performs data communication with the non-volatile memory 30. The memory controller 19 performs processing for writing user data to the non-volatile memory 30 on the basis of a command of the processor 12. The memory controller 19 performs processing for reading from the non-volatile memory 30 on the basis of a command of the processor 12.

The PMC (Power Management Controller) 17 controls the voltage of the entire memory system 1. The PMC 17 determines a voltage value appropriate for each module in the memory system 1 on the basis of Gen information sent from the PCIe controller 11 via the bus.

The PMC 17 reduces the internal voltage of the memory system 1 in a case where the PCIe Gen designated by the Gen information is a Gen of which processing load of the controller 10 is less than that of the PCIe Gen that can be applied in the memory system 1.

For example, in a case where the PCIe that can be applied in the memory system 1 is PCIe Gen3, and the PCIe Gen designated by the Gen information is PCIe Gen2 or PCIe Gen1, the PMC 17 reduces the internal voltage of the memory system 1.

In a case where the PCIe that can be applied in the memory system 1 is PCIe Gen2, and the PCIe Gen designated by the Gen information is PCIe Gen1, the PMC 17 reduces the internal voltage of the memory system 1.

The PMC 17 determines a voltage value appropriate for each module in the memory system 1. The PMC 17 previously stores information associating a module, Gen information, and a voltage value (the voltage correspondence relationship information 101 explained later). The PMC 17 determines the voltage corresponding to each module on the basis of this voltage correspondence relationship information 101. The PMC 17 sends the determined voltage value via the I2C 18 to the power supply IC 26. The I2C (Inter-Integrated Circuit) 18 performs communication between the PMC 17 and the power supply IC 26.

The power supply IC 26 is connected to each module in the controller 10, and supplies the voltage to each module in accordance with a command from the PMC 17. The power supply IC 26 is connected to the PCIe connector 25, and supplies a voltage to the PCIe connector 25. The power supply IC 26 is connected to the non-volatile memory 30 (not illustrated), and supplies the voltage to the non-volatile memory 30.

The clock management module 20 supplies a clock to each module in the memory system 1, and determines a clock frequency appropriate for each of them on the basis of the Gen information sent from the PCIe controller 11.

For example, in a case where the PCIe that can be processed by the memory system 1 is PCIe Gen3, and the PCIe Gen designated by the Gen information is PCIe Gen2 or PCIe Gen1, the clock management module 20 reduces the clock frequency of the predetermined module of the memory system 1.

In a case where the PCIe that can be processed by the memory system 1 is PCIe Gen2, and the PCIe Gen designated by the Gen information is PCIe Gen1, the clock management module 20 reduces the clock frequency of the predetermined module of the memory system 1.

The clock management module 20 previously stores information associating a module, Gen information, and a clock frequency (the clock correspondence relationship information 102 explained later). The clock management module 20 determines the clock frequency corresponding to each module on the basis of this clock correspondence relationship information 102.

The temperature sensor 21 detects the temperature of the controller 10. The temperature sensor 21 sends the detected temperature to the PMC 17 and the clock management module 20. The RAM 27 stores management information with which the controller 10 accesses the non-volatile memory 30. This management information includes information indicating a correspondence relationship between an LBA designated by the host 2 and a physical address where user data are stored.

The RAM 27 is used by the controller 10 as a buffer for data transfer between the host 2 and the non-volatile memory 30. The RAM 27 is also used as a buffer to which a firmware program executed by the processor 12 is loaded.

Figure 3:
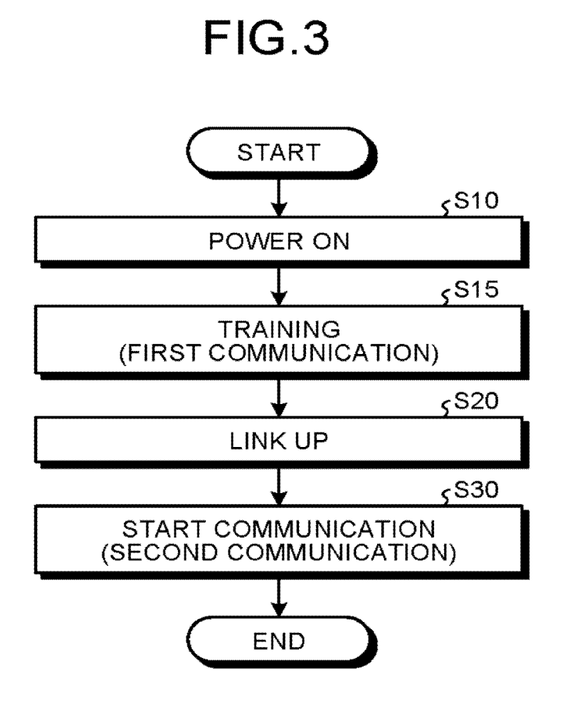
FIG. 3 is a flowchart illustrating an operation processing procedure of a memory system according to an embodiment.

FIG. 3 is a flowchart illustrating an operation processing procedure of a memory system according to an embodiment. FIG. 3 illustrates an operation of the PCIe controller 11 for the host 2 when the information processing system is powered on. When the information processing system is powered on (step S10), the information processing system performs training sequence (first communication) (step S15). This training is performed before communication of user data and the like is performed between the host 2 and the memory system 1.

When the training is completed, link up is established (step S20). In the link up, the PMC 17 determines a voltage value appropriate for each module in the memory system 1 on the basis of the voltage correspondence relationship information 101 and the Gen information and the number of lanes of the training result (configuration result) sent from the PCIe controller 11.

Figure 4:
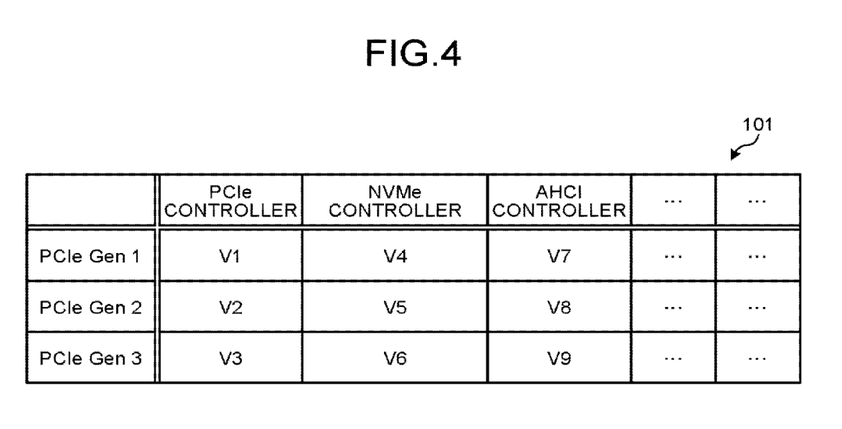
FIG. 4 is a figure illustrating a configuration of voltage correspondence relationship information.

In this case, the configuration of the voltage correspondence relationship information 101 will be explained. FIG. 4 is a figure illustrating a configuration of voltage correspondence relationship information. A module, Gen information, and a voltage value are associated in the voltage correspondence relationship information 101. For example, the voltage value of the PCIe controller 11 in the case of "PCIe Gen1" is "V1". Likewise, the voltage value of the PCIe controller 11 in the case of "PCIe Gen2" is "V2".

The PMC 17 associates the module and the voltage value and sends them to the power supply IC 26. The power supply IC 26 supplies a voltage to each module in accordance with the voltage value sent via the I2C 18 from the PMC 17.

In the link up, the clock management module 20 determines a clock frequency appropriate for each module in the memory system 1 on the basis of the clock correspondence relationship information 102 and the Gen information and the number of lanes of the training result sent from the PCIe controller 11.

Figure 5:
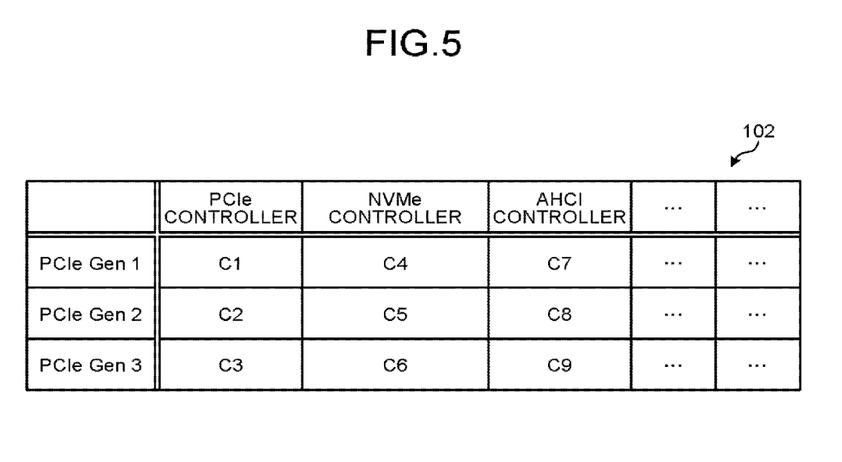
FIG. 5 is a figure illustrating a configuration of clock correspondence relationship information.

Hereinafter, a configuration of the clock correspondence relationship information 102 will be explained. FIG. 5 is a figure illustrating a configuration of clock correspondence relationship information. A module, Gen information, and a clock frequency are associated in the clock correspondence relationship information 102. For example, the clock frequency of the PCIe controller 11 in the case of "PCIe Gen1" is "C1". Likewise, the clock frequency of the PCIe controller 11 in the case of "PCIe Gen2" is "C2".

After the clock management module 20 adjusts the clock frequency in accordance with the module, the clock management module 20 supplies a clock to each module. Thereafter, when the voltage value and the clock are stabilized in each module, the controller 10 starts data communication (second communication) with the host 2 (step S30).

Figure 6:
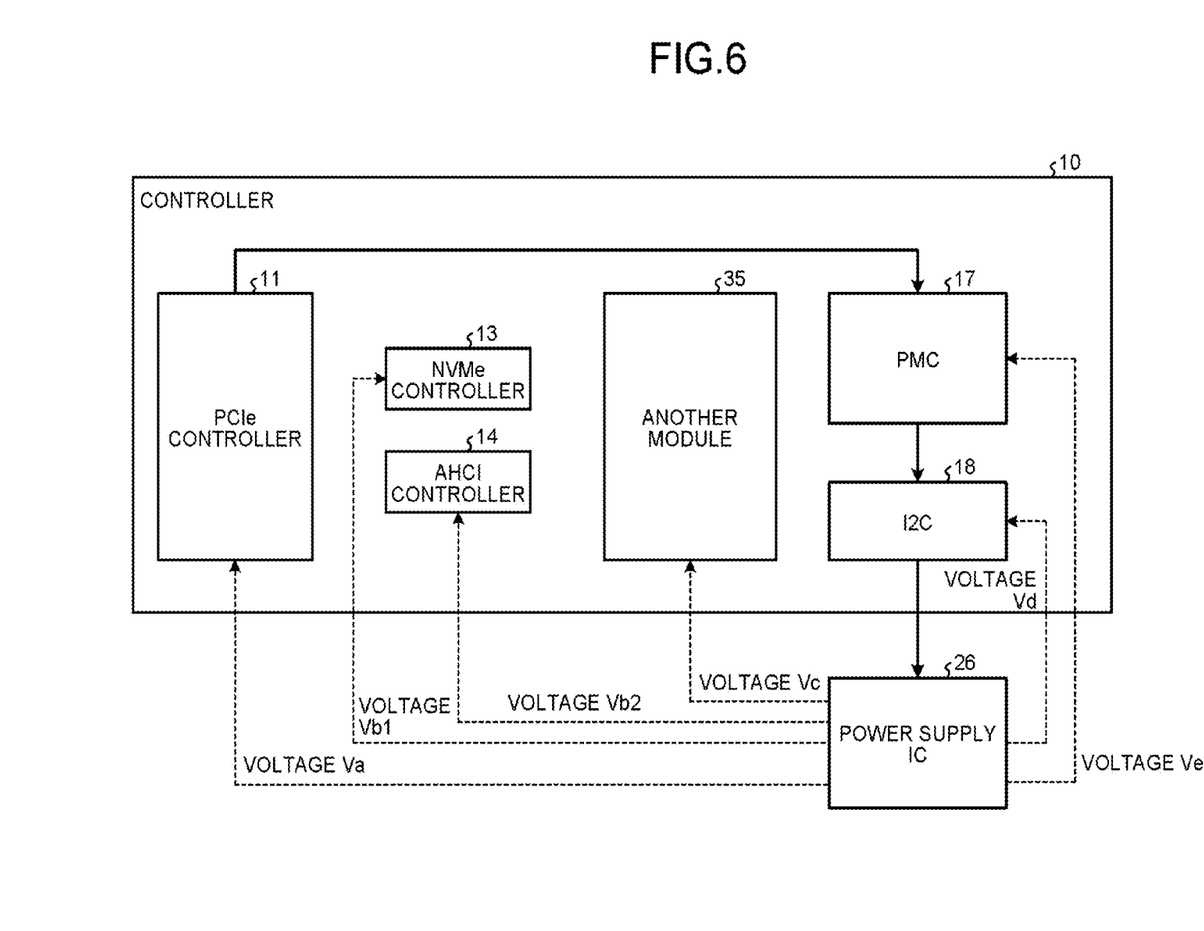
FIG. 6 is a figure for explaining voltage control processing with a memory system according to an embodiment.

FIG. 6 is a figure for explaining voltage control processing of a memory system according to an embodiment. For example, the PMC 17 determines that the voltage value appropriate for the PCIe controller 11 is a voltage Va, on the basis of the Gen information from the PCIe controller 11. The voltage Va is any one of the voltages V1 to V3 as illustrated in FIG. 4.

The PMC 17 determines that the voltage value appropriate for the NVMe controller 13 is a voltage Vb1 on the basis of the Gen information. The voltage Vb1 is any one of the voltages V4 to V6 as illustrated in FIG. 4. The PMC 17 determines that the voltage value appropriate for the AHCI controller 14 is the voltage Vb2 on the basis of the Gen information. The voltage Vb2 is any one of the voltages V7 to V9 as illustrated in FIG. 4.

The PMC 17 determines that the voltage value appropriate for another module 35 is the voltage Vc on the basis of the Gen information. The PMC 17 determines that the voltage value appropriate for the PMC 17 is the voltage Ve and that the voltage value appropriate for the I2C 18 is the voltage Vd on the basis of the Gen information.

Then, the PMC 17 sends the determined voltage value via the I2C 18 to the power supply IC 26. The voltages Va to Ve are voltages equal to or less than a voltage that is set in advance in the controller 10 (reference voltage).

In this case, another module 35 is a module other than the PCIe controller 11, the NVMe controller 13, the AHCI controller 14, the PMC 17 and the I2C 18. The another module 35 is, for example, a processor 12, an encoding/decoding unit 15, and the like.

The power supply IC 26 supplies a voltage to each module in accordance with the voltage value sent from the PMC 17. More specifically, the power supply IC 26 supplies the voltage Va to the PCIe controller 11. The power supply IC 26 supplies the voltage Vb1 to the NVMe controller 13, and supplies the voltage Vb2 to the AHCI controller 14. The power supply IC 26 supplies the voltage Vc to another module 35. The power supply IC 26 supplies the voltage Ve to the PMC 17, and supplies the voltage Vd to the I2C 18.

Therefore, the PCIe controller 11 operates at the voltage Va. The NVMe controller 13 operates at the voltage Vb1, and the AHCI controller 14 operates at the voltage Vb2. Another module 35 operates at the voltage Vc. The PMC 17 operates at the voltage Ve, and the I2C 18 operates at the voltage Vd.

The voltage value supplied to each module is optimized, so that the Dynamic Power and the Static Power of the memory system 1 can be reduced. Where the supply voltage is V, and the clock frequency is f, the Dynamic Power is proportional to $V^2 f$. Where the electric current flowing in the device is denoted as I, the Static Power is denoted as IV. Since the Dynamic Power is depending on a square of the supply voltage, the memory system 1 can greatly reduce the Dynamic Power.

Figure 7:
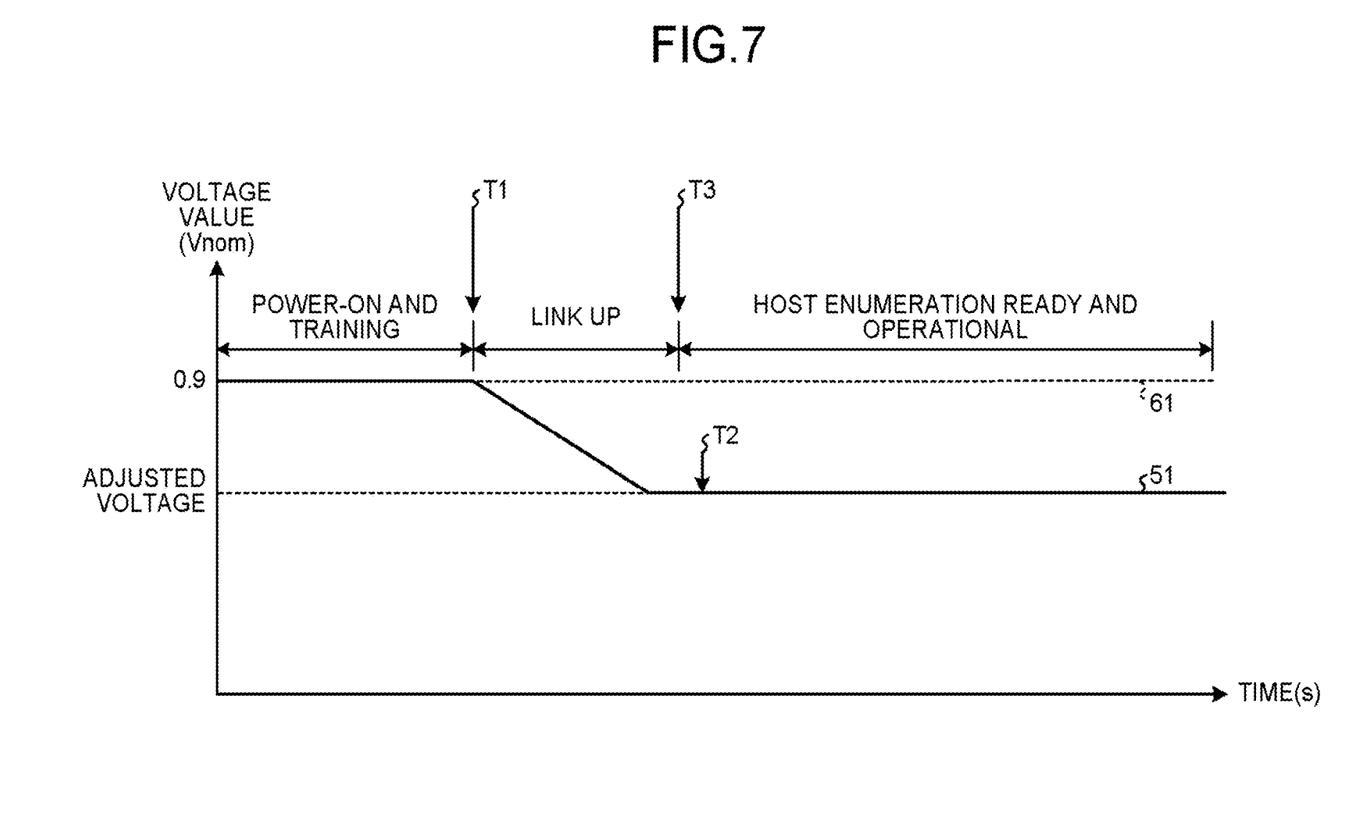
FIG. 7 is a time chart illustrating a voltage adjustment processing procedure of a memory system according to an embodiment.

FIG. 7 is a time chart illustrating a voltage adjustment processing procedure of a memory system according to an embodiment. FIG. 7 illustrates a voltage value of a digital circuit used in the memory system 1 (core voltage). The digital circuit is, for example, a PCIe controller 11, an NVMe controller 13, an AHCI controller 14, a PMC 17, and the like. From when the memory system 1 is powered on to when the training is completed, the memory system 1 operates at a first voltage (for example, 0.9 V) which is the reference voltage.

Thereafter, when a link up is established (T1), the PMC 17 determines a voltage value appropriate for a module in the memory system 1 (a second voltage) on the basis of the Gen information and the voltage correspondence relationship information 101. Then, the PMC 17 sends the determined voltage value to the power supply IC 26. Accordingly, each module operates at a voltage supplied from the power supply IC 26 (adjusted voltage). In other words, when the voltage adjustment is started, the voltage used in each module is adjusted to a second voltage which is less than the first voltage.

The properties 51, 61 are voltage properties indicating a change of the voltage value over a time. FIG. 7 illustrates a case where the operation voltage of the module is reduced from the reference voltage (0.9 V) to the adjusted voltage as illustrated by the property 51. When the adjusted voltage is stabilized and the preparation of the memory system 1 is completed, the PCIe controller 11 starts communication with the host 2 (T2). Therefore, the information processing system is in the operable state.

The property 61 illustrated in FIG. 7 indicates the voltage property in a case where the operation voltage of the module is not adjusted. In this case, the memory system 1 is powered on at the reference voltage, and the training sequence, and then the communication operation are executed (T3).

Figure 8:
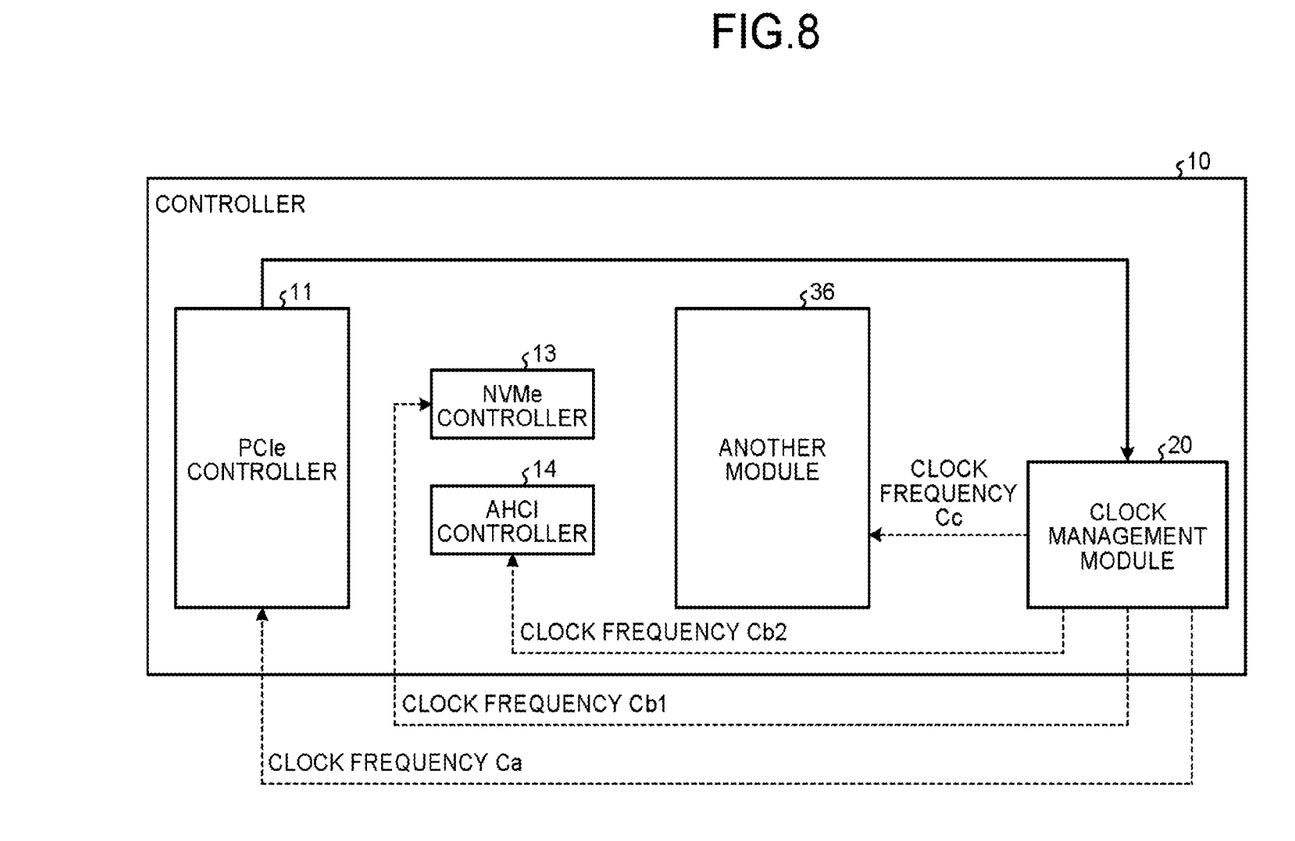
FIG. 8 is a figure for explaining clock control processing of a memory system according to an embodiment.

FIG. 8 is a figure for explaining clock control processing of a memory system according to an embodiment. For example, the clock management module 20 determines that the clock frequency appropriate for the PCIe controller 11 is the clock frequency Ca on the basis of the Gen information from the PCIe controller 11. The clock frequency Ca is any one of the clock frequencies C1 to C3 as illustrated in FIG. 5.

The clock management module 20 determines that the clock frequency appropriate for the NVMe controller 13 is the clock frequency Cb1 on the basis of the Gen information. The clock frequency Cb1 is any one of the clock frequencies C4 to C6 as illustrated in FIG. 5.

The clock management module 20 determines that the clock frequency appropriate for the AHCI controller 14 is the clock frequency Cb2 on the basis of the Gen information. The clock frequency Cb2 is any one of the clock frequencies C7 to C9 as illustrated in FIG. 5.

The clock management module 20 determines that the clock frequency appropriate for another module 36 is the clock frequency Cc on the basis of the Gen information. In this case, another module 36 is a module other than the PCIe controller 11, the NVMe controller 13, the AHCI controller 14, and the clock management module 20. The clock frequency Ca to Cc can be a clock frequency less than a clock frequency that is set in advance in the controller (reference clock frequency). Accordingly, the memory system 1 can greatly reduce the Dynamic Power by adjusting the clock frequency of each module.

Figure 9:
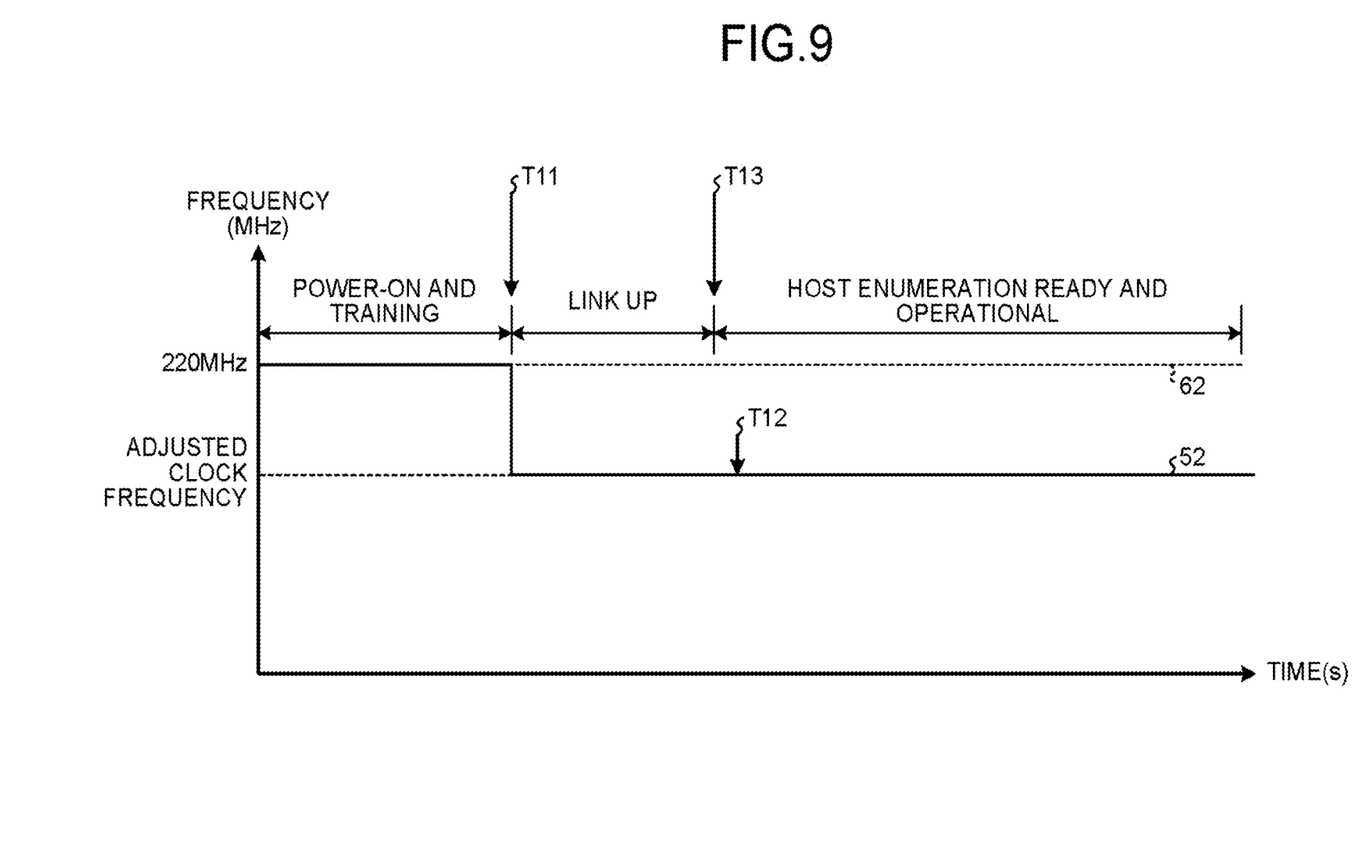
FIG. 9 is a time chart illustrating a clock frequency adjustment processing procedure of a memory system according to an embodiment.

FIG. 9 is a time chart illustrating clock frequency adjustment processing procedure of a memory system according to an embodiment. FIG. 9 illustrates a clock frequency (for example, 220 MHz) used in the memory system 1. From when the memory system 1 is powered on to when the training is completed, the memory system 1 operates at a first clock frequency which is the reference clock frequency.

Thereafter, when the link up is established (T11), the clock management module 20 determines, on the basis of the Gen information and the clock correspondence relationship information 102, a frequency appropriate for the clock (second clock frequency), and supplies the adjusted clock. Accordingly, each module using the clock performs operation with the adjusted clock.

The properties 52, 62 are frequency properties indicating a change of the operation frequency over a time. FIG. 9 illustrates a case where the operation frequency of the module is reduced from the reference clock frequency (220 MHz) to the adjusted clock frequency (optimized frequency) as illustrated by the property 52. When the adjusted clock is stabilized and the preparation of the memory system 1 is completed, the PCIe controller 11 starts communication with the host 2 (T12). Therefore, the information processing system is in the operable state. In a case where the voltage value and the clock frequency are adjusted, the controller 10 starts communication with the host 2 after both of the adjusted voltage value and the clock frequency are stabilized.

The property 62 illustrated in FIG. 9 indicates the property of the clock frequency in a case where the clock frequency of the module is not adjusted. In this case, after power-on at the reference clock frequency, operation is performed while the frequency is still maintained (T13).

It should be noted that the PMC 17 may determine the voltage value of each module on the basis of the PCIe lane configuration included in the information where a link up is established. The PCIe lane configuration indicates the number of lanes used for communication of data between the memory system 1 and the host 2. The lane configuration includes, for example, 1 lane, 2 lanes, 4 lanes, and the like. The clock management module 20 may also determine the clock frequency of each module on the basis of the lane configuration.

As described above, the memory system 1 selects an operation voltage and a clock frequency appropriate for the performance of itself on the basis of a result of link up with the host 2 during initialization. For example, even in the case where the upper limit performance in the memory system 1 is 3.2 GB/s when the memory system 1 has four-lane configuration and PCIe Gen3, the performance is 1.6 GB/s, which is half, when the memory system 1 operates with two-lane configuration and PCIe Gen3. In this case, the memory system 1 can reduce from the reference clock frequency to the clock frequency as illustrated in FIG. 9. In accordance with the reduction of the clock frequency, this makes a margin in the operation timing, and therefore, the memory system 1 can reduce the core voltage as illustrated in FIG. 7. The voltage value and the clock frequency of each module are adjusted to appropriate values, so that the Dynamic Power and the Static Power can be reduced.

It should be noted that the controller 10 adjusts the voltage value and the clock frequency at the power-on, but the controller 10 is not limited thereto, and the controller 10 may also adjust the voltage value and the clock frequency at the restart.

The controller 10 may readjust the voltage value and the clock frequency in a case where the PCIe Gen and the lane configuration determined at the link up with the host 2 are changed by a command from the host 2.

The controller 10 may divide the inside of the controller 10 by domains, and may adjust the voltage value and the clock frequency in units of domains. In other words, the controller 10 may adjust the voltage value and the clock frequency for each domain that is set in the controller 10.

In a case where the controller 10 performs compaction (garbage collection), and the transfer rate at the side of the host 2 decreases and the internal processing load increases, the memory controller 19 may be caused to operate with the reference voltage and the reference clock frequency. The compaction is processing for organizing invalid user data and the like in a block of the non-volatile memory 30. It should be noted that the memory system 1 may perform only one of the adjustments of the voltage adjustment and the clock frequency.

As described above, in the memory system 1 according to the embodiment, the PMC 17 determines the voltage supplied to the module in the controller 10 on the basis of the operation condition and the internal processing situation determined with the host 2. Then, the power supply IC 26 adjusts the voltage supplied to the module in accordance with a command from the PMC 17. Accordingly, the memory system 1 can operate with a voltage appropriate for the operation condition.

The clock management module 20 adjusts the clock sent to the module in the controller 10 on the basis of the operation condition and the internal processing situation determined with the host 2. Accordingly, the memory system 1 can operate at a clock frequency suitable for the operation condition.

As a result, the memory system 1 can reduce the total amount of Dynamic Power and Static Power. Therefore, the memory system 1 can operate with lower electric power consumption.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a non-volatile memory configured to store data;
   a controller circuit configured to control the non-volatile memory, the controller circuit including a plurality of functional circuits, and the controller circuit being capable of connecting with a host via a serial interface; and
   a power supplier configured to supply voltage to a functional circuit on the basis of an operation condition determined with the host.

2. The memory system according to claim 1, wherein the plurality of functional circuits includes an interface control circuit that performs a data communication with the host using the serial interface in compliance with a specification of the serial interface.

3. The memory system according to claim 1, wherein the power supplier supplies a first voltage to a first functional circuit after the memory system is powered on, and
   after a link up sequence with the host is completed, the power supplier supplies a second voltage to the first functional circuit, the second voltage being lower than the first voltage.

4. The memory system according to claim 1, wherein the operation condition is a connection condition determined during a link up sequence with the host.

5. The memory system according to claim 4, wherein the connection condition is an interface speed of a data communication.

6. The memory system according to claim 4, wherein the connection condition is the number of lanes used between the memory system and the host.

7. The memory system according to claim 1, wherein the power supplier supplies the voltage in units of domains that are set in the controller circuit.

8. The memory system according to claim 1, wherein the power supplier supplies a first voltage to a first functional circuit, and supplies a second voltage to a second functional circuit, the second voltage being different from the first voltage.

9. The memory system according to claim 1, wherein the power supplier manages a relation between the voltage and the operation condition.

10. The memory system according to claim 1, wherein the serial interface is one of a Peripheral Component Interconnect Express (PCIe) interface, a Serial Advanced Technology Attachment (SATA) interface, and a Serial Attached SCSI (SAS) interface.

11. A memory system comprising:
    a non-volatile memory configured to store data;
    a controller circuit configured to control the non-volatile memory, the controller circuit including a plurality of functional circuits, and the controller circuit being capable of connecting with a host via a serial interface; and
    a clock supplier configured to supply an operation clock to a functional circuit on the basis of an operation condition determined with the host.

12. The memory system according to claim 11, wherein the plurality of functional circuits includes an interface control circuit that performs a data communication with the host using the serial interface in compliance with a specification of the serial interface.

13. The memory system according to claim 11, wherein the clock supplier supplies a first operation clock to a first functional circuit after the memory system is powered on, and
    after a link up sequence with the host is completed, the clock supplier supplies a second operation clock to the first functional circuit, the frequency of the second operation clock being slower than the frequency of the first operation clock.

14. The memory system according to claim 11, wherein the operation condition is a connection condition determined during a link up sequence with the host.

15. The memory system according to claim 14, wherein the connection condition is an interface speed of a data communication.

16. The memory system according to claim 14, wherein the connection condition is the number of lanes used between the memory system and the host.

17. The memory system according to claim 11, wherein the clock supplier supplies the operation clock in units of domains that are set in the controller circuit.

18. The memory system according to claim 11, wherein the clock supplier supplies a first operation clock to a first functional circuit, and supplies a second operation clock to a second functional circuit, the frequency of the second operation clock being different from the frequency of the first operation clock.

19. The memory system according to claim 11, wherein the clock supplier manages a relation between the operation clock and the operation condition.

20. The memory system according to claim 11, wherein the serial interface is one of a Peripheral Component Interconnect Express (PCIe) interface, a Serial Advanced Technology Attachment (SATA) interface, and a Serial Attached SCSI (SAS) interface.

* * * * *